US006873093B2

(12) United States Patent
Yu et al.

(10) Patent No.: US 6,873,093 B2
(45) Date of Patent: Mar. 29, 2005

(54) ORGANIC LIGHT EMITTING DIODE DISPLAY STRUCTURE

(75) Inventors: Huinan Yu, Buffalo Grove, IL (US); Zili Li, Barrington, IL (US)

(73) Assignee: Motorola, Inc., Schaumburg, IL (US)

( * ) Notice: Subject to any disclaimer, the term of this patent is extended or adjusted under 35 U.S.C. 154(b) by 81 days.

(21) Appl. No.: 10/376,081

(22) Filed: Feb. 28, 2003

(65) Prior Publication Data

US 2004/0169452 A1 Sep. 2, 2004

(51) Int. Cl.[7] .................................................. H01J 5/16
(52) U.S. Cl. ........................ 313/112; 313/504; 313/506
(58) Field of Search ................................ 313/112, 498, 313/504, 506

(56) References Cited

U.S. PATENT DOCUMENTS

2004/0070333 A1 * 4/2004 Lin et al. ..................... 313/500

FOREIGN PATENT DOCUMENTS

WO   WO 98/28767   7/1998

OTHER PUBLICATIONS

Popovic Z.D.; Aziz H. Reliability and Degradation of Small Molecule–Based Organic Light–Emitting Devices (OLEDs) IEEE Journal on Selected Topics in Quantum Electronics vol. 8, No. 2 Mar./Apr. 2002.
Steranka F.; Hodapp M. "Advances in LED Performance open New Markets for the Technology" 1998 The Photonics Design and Applications Handbook.

* cited by examiner

Primary Examiner—Vip Patel
(74) Attorney, Agent, or Firm—James A. Lamb

(57) ABSTRACT

A display structure (200, 500, 600, 700, 800) comprises an emissive layer (260, 360, 460) and an excitation prevention layer (270, 370, 470, 735, 840). The emissive layer includes a set of first color emitting areas (211, 216, 221, 311, 316, 321, 411, 416, 421) that emit a first color light in response to light that is generated by a first set of light emitting diodes (LEDs) (210, 215, 220, 310, 315, 320, 410, 415, 420) that are preferably organic. The excitation prevention layer is disposed at the front side of the emissive layer and includes a first set of excitation prevention filter areas (225, 230, 235, 325, 330, 335, 420, 430, 435). In one embodiment, a first set of excitation prevention filter areas block a band of the light that is incident upon the emissive layer from the front of the display, wherein the blocked band of light is within an excitation band of the first set of LEDs.

21 Claims, 4 Drawing Sheets

ORGANIC LIGHT EMITTING DIODE DISPLAY STRUCTURE

FIELD OF THE DISCLOSURE

This disclosure relates generally to emissive multicolor displays, and more particularly to a display structure for light emitting diode displays.

BACKGROUND

Organic light emitting diode (OLED) displays have several advantages over liquid crystal displays (LCDs) in display applications. For example, they have better visual performance in low ambient light conditions because they are emissive. They also have superior temperature stability since molecular motion is essentially not involved in operating OLED displays, while it is essential for the operation of LCDs. However, the implementation of OLED displays in handheld equipment has been hindered by several problems. One of them is poor sunlight readability. The on and off pixels become indistinguishably bright under sunlight, due to light emanating from pixels that are in the OFF state. The sunlight visibility problem has been attributed to sunlight reflection at the OLED cathodes of pixels in the OFF state. Circular polarizers (a linear polarizer combined with a quarter wave plate) have been used to block the reflected sunlight from cathodes. The effect of this approach has been far from satisfactory with reference to its performance in high ambient light conditions such as direct sunlight. In another approach described in International Publication WO 98/28767, entitled An Organic Light Emitting Device Containing a Protection Layer, published on 2 Jul. 1998, a low-reflectance absorber layer is used at the back of transparent OLED (TOLED) displays to improve contrast ratio under sunlight. This method provides less than optimum results in direct sunlight.

SUMMARY OF THE INVENTION

This invention substantially improves the readability of LED displays in high ambient light conditions, such as direct sunlight.

In a first aspect of the invention, a display includes first, second, and third sets of LEDs that emit, respectively, blue, green and red light towards a front of the display from, respectively, sets of blue, green, and red emitting areas, and also includes an excitation prevention layer that comprises three sets of excitation prevention filter areas that positionally match, respectively, the sets of blue, green, and red emitting areas.

In a second aspect of the invention, a display structure generally includes an emissive layer that includes a set of first color emitting areas that emit a first color light in response to light that is generated by a first set of light emitting diodes (LEDs) that emit a second color light towards a front of the display from a corresponding first set of LED emitting areas, and also includes an excitation prevention layer disposed at the front side of the emissive layer that includes a first set of excitation prevention filter areas that positionally match the set of first LED emitting areas.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The present invention provides a display based on organic light emitting devices having improved contrast ratio under high ambient light conditions such as direct sunlight.

Figure 1:
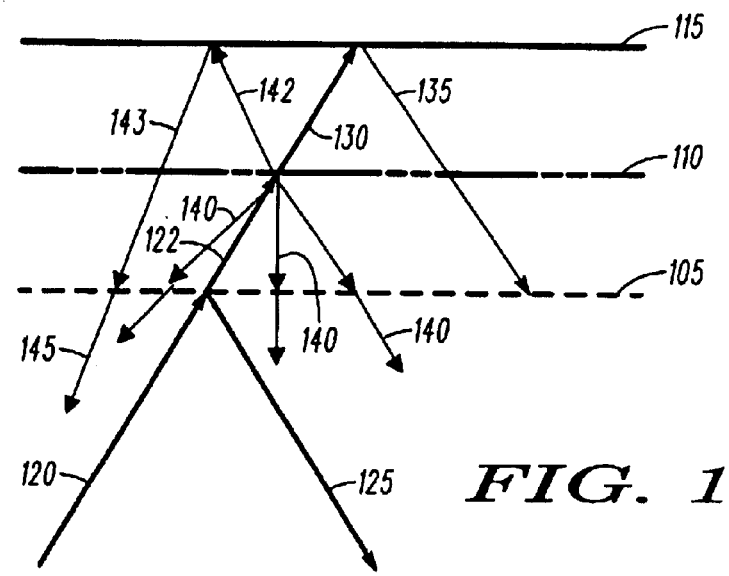
FIG. 1 shows a cross sectional diagram of an example of an organic light emitting diode (OLED) display using light beams, layers, and surfaces, in accordance with prior art implementations.

Referring to FIG. 1, a cross sectional diagram of an example of an organic light emitting diode (OLED) display showing light beams, layers, and surfaces is shown, in accordance with prior art implementations. The OLED display comprises a circular polarizer 105 at the front of the OLED display, an organic emissive layer 110 in the OLED display, and a cathode layer 115 in the back of the organic emissive layer 110. The cathode layer 115 typically comprises electrically conductive materials such as aluminum, calcium, or magnesium that reflect light quite well. The circular polarizer 105 comprises a linear polarizer combined with a quarter wave plate. The organic emissive layer 110 comprises a plurality of OLEDs, of which one is shown in FIG. 1. Each of the OLEDs, when ON, emits light having wavelengths within a color band that provides a monochrome appearance of the emitted light, such as blue, green, or red. In the example shown in FIG. 1, an incident beam of bright, broad spectrum light 120 enters the OLED display from the front. A portion 125 (e.g., 4%) is reflected off the front surface of the circular polarizer 105 and the remainder passes through 122 or else is absorbed by the circular polarizer 105. The remainder 122 of the incident beam 120 that passes through the circular polarizer 105 is circularly polarized, for example becoming right handed polarized light, and then encounters the OLED in the organic emissive layer 110. Whether the OLED is on or off, a first portion 130 of the remainder 122 of the incident beam 120 passes through the OLED and is reflected off the cathode layer 115, the "handedness" is reversed by the reflection, which for the example changes it to left handed polarized light. The reflected beam is shown in FIG. 1 as beam 135. At least a part of this beam passes back through the OLED but is blocked by the linear polarizer portion of the circular polarizer 105 since it now has reversed handedness with reference to the circular polarizer 105.

Another portion of the part 122 of the incident beam 120 that makes it through the circular polarizer 105 interacts with the electroluminescent materials in the OLED, causing photoluminescent (PL) light emissions to occur that are within a color band that is near the color band of the OLED with which the portion interacts. These emissions are typically non-polarized. Some of the emissions 140 are emitted towards the circular polarizer 105 and a portion of them pass through, while some are absorbed. However, the absorption rate is not very high, as it is for the polarized reflections 135, because the PL light 140 is not polarized. Another part of the emissions 142 are emitted towards the cathode layer 115, are reflected 143, and a portion of them 145 that are not blocked by the OLED pass through the circular polarizer for the same reason that the emissions 140 pass through, while some are absorbed.

When the incident light beam 120 is sufficiently intense, the amount of light that comes back through the circular polarizer 105 can be enough that the combined brightness of an OLED that is ON, caused by the light emitted by electroluminescence and by photoluminescence is not much different than the brightness of an OLED that is OFF, due solely to photoluminescence, making the information being presented by the OLEDs in the organic emissive layer 110 difficult or impossible to discern.

Figure 2:
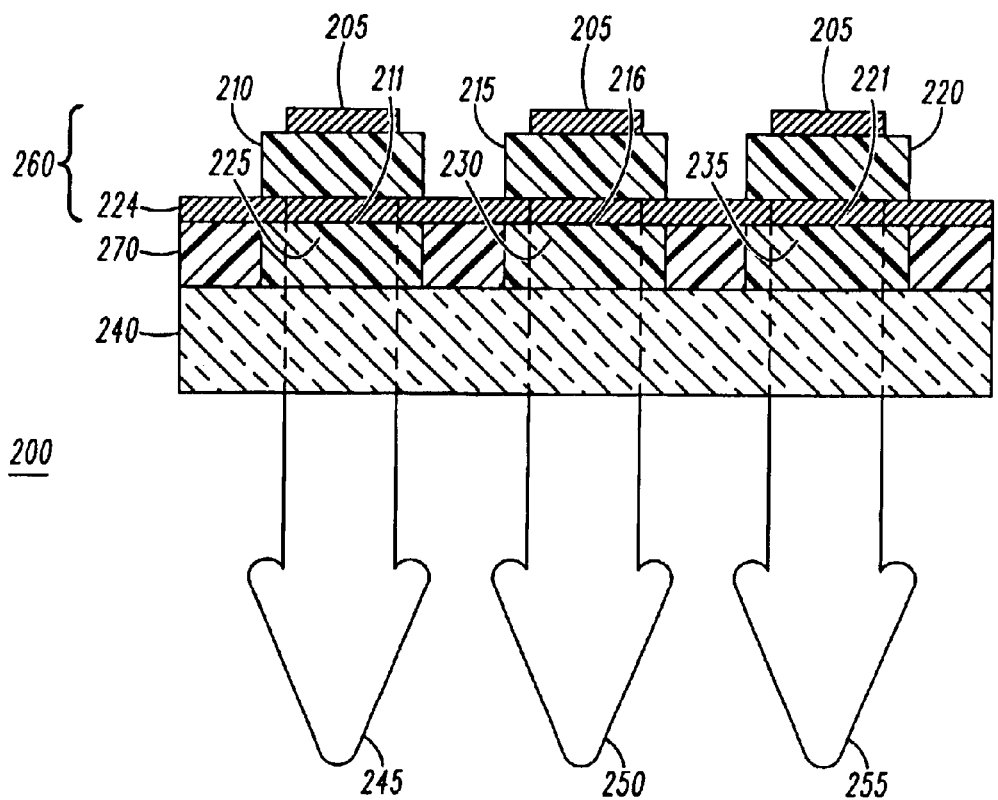
FIG. 2 shows a cross sectional view of a display structure, in accordance with a preferred embodiment of the present invention.

Referring now to FIG. 2, a cross sectional view of a display structure 200 is shown, in accordance with a preferred embodiment of the present invention. The display structure 200 comprises three sets of organic light emitting diodes (OLEDs) that form a portion of a display, of which one OLED from each set is shown, a blue OLED 210, a green OLED 215, and a red OLED 220 that emit blue light 245, green light 250, and red light 255 respectively. In this context, the blue light 245 is light comprising a range of wavelengths generated by electroluminescence in a blue color band (or, more simply, light in a blue color band) that make the light appear to be blue under normal ambient light circumstances. Analogous statements apply for the green light 250 and red light 255.

The blue light 245 is emitted through a transparent electrode 224 on the front side of the blue OLED 210 towards a front of the display (as indicated by the arrow representing the blue light 245) from a blue OLED emitting area 211 of an organic emissive layer 260 of the display structure 200. The blue OLED emitting area 211 can be described as the region at the front of organic emissive layer 260 (in this case, this is a region of the front surface of the transparent electrode layer 224) through which light from the front of the OLED 210 passes. Likewise, the green light 250 and the red light 255 are emitted, respectively through the transparent electrode 224 from a green OLED emitting area 216 and a red OLED emitting area 221 of the organic emissive layer 260 toward the front of the display. The organic emissive layer 260 comprises sets of blue, green, and red emitting areas, of which the blue, green and red emitting areas 211, 216, 221 are exemplary members. The transparent electrode 224 is preferably a transparent anode, and may comprise several electrodes coupled to a common voltage source, or coupled to multiple voltage sources having voltages optimized for the differing colors. Towards the back of the display structure, electrodes are disposed on a backside of each OLED. These electrodes 205 are preferably cathodes (i.e., negative with reference to the transparent electrode 224 when turned on) and voltage potentials on each of the cathodes 205 are capable of being switched.

Toward the front of the display structure from the organic emissive layer 260 is an excitation prevention layer 270 that comprises three sets of excitation prevention filter areas that positionally match (i.e., axially aligned with), respectively, the sets of blue, green, and red OLED emitting areas 211, 216, 221. A first excitation prevention filter area 225, a second excitation prevention filter area 230, and a third excitation prevention filter area 235 that are respective members of the three sets of excitation prevention filter areas are shown in FIG. 2. The excitation prevention layer 270 is shown disposed in front of and adjacent to the organic emissive layer 260 in this example, but it need not be disposed adjacent to the organic emissive layer 260. Lastly, a transparent front supporting layer 240 is shown in FIG. 2. The transparent front supporting layer 240 is preferably a glass plate or a plastic film that is passivated, but it could be of other construction.

Figure 3:
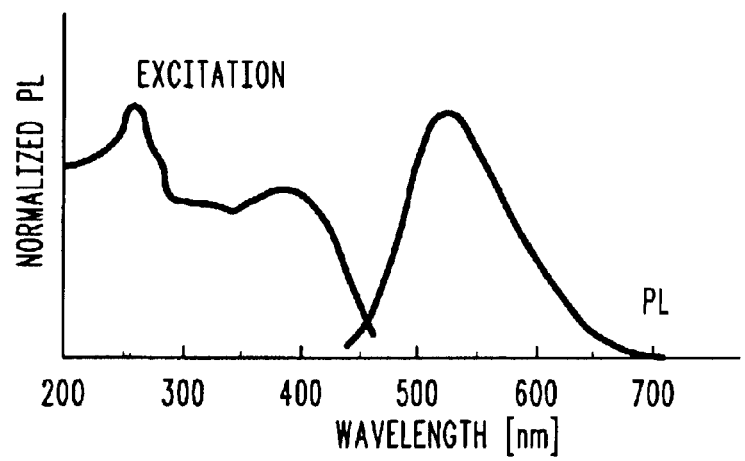
FIGS. 3 and 4 show spectral diagrams for exemplary small molecule (FIG. 3) and polymer (FIG. 4) electroluminescent organic light emitting materials, in accordance with the present invention.
Figure 4:
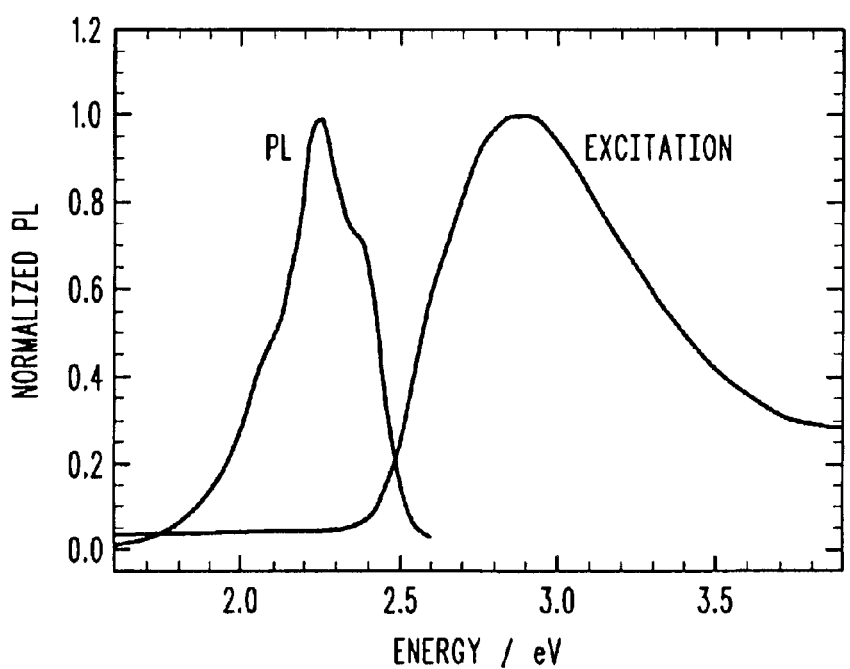

Referring to FIGS. 3 and 4, spectral diagrams are shown for exemplary small molecule (FIG. 3) and polymer (FIG. 4) electroluminescent organic light emitting materials, in accordance with the present invention. The spectral diagrams illustrate bands of light labeled PL at which the respective materials emit light due to photoluminescence (PL) when excited by incident light within bands of light labeled EXCITATION. (In FIG. 4, higher energy levels correspond to shorter wavelengths.) The PL bands in both cases closely correspond to the range of wavelengths that are emitted due to electroluminescence (EL) when an appropriate voltage potential is applied across the exemplary OLED. It will be appreciated that the wavelengths of a major portion of the excitation band of a color OLED are typically shorter than the wavelengths of a major portion of the PL band of the color OLED, and therefore a filter area that blocks a significant range of the wavelengths of the excitation band while passing a significant amount of the wavelengths of the PL band (which is more simply referred to as an excitation prevention filter area) prevents incident light from inducing PL in the color OLED while not interfering significantly with the light emitted by the color OLED due to EL while it is in the ON state. It will be further appreciated that the excitation prevention filter area for a particular color OLED can be a band blocking filter that selectively blocks the excitation band, or a high pass filter with a cutoff wavelength that is between the peaks of the excitation band and the PL band for that color OLED. It will be further appreciated that a high pass type excitation prevention filter area for a blue OLED will pass the EL generated light of a blue emitting OLED, a green emitting OLED, and a red emitting OLED without substantial reduction.

Referring back to FIG. 2, the excitation prevention filter area 225 of the first set of excitation prevention filter areas blocks a band of light within the light that is incident upon the organic emissive layer 260 from the front of the display (not shown FIG. 2, but represented by the remainder light beam 122 in FIG. 1), wherein the blocked band of light is within the excitation band of the first set of OLEDs. An analogous statement applies to the second and third sets of excitation prevention filter areas. In general, the sets of excitation prevention filter areas each block a band of the light that is incident upon the organic emissive layer 260 from the front of the display, wherein the blocked band of light is within an excitation band of the respective set of OLEDs. The sets of excitation prevention filter areas 225, 230, 235 may be made from conventional filter materials or any light filtering materials.

In general, the preferred embodiment of the present invention described with reference to FIG. 2 can be described as comprising first, second, and third sets of OLEDs (of which OLEDs 210, 215, and 220 are respective members) that emit, respectively, blue, green and red light 245, 250, 255 towards the front of the display from, respectively, sets of blue, green, and red OLED emitting areas (including the illustrated emitting areas 211, 216, 221), and an excitation prevention layer 270 that comprises three sets of excitation prevention filter areas (including the illustrated filter areas 225, 230, 235) that positionally match, respectively, the sets of blue, green, and red emitting areas.

Figure 5:
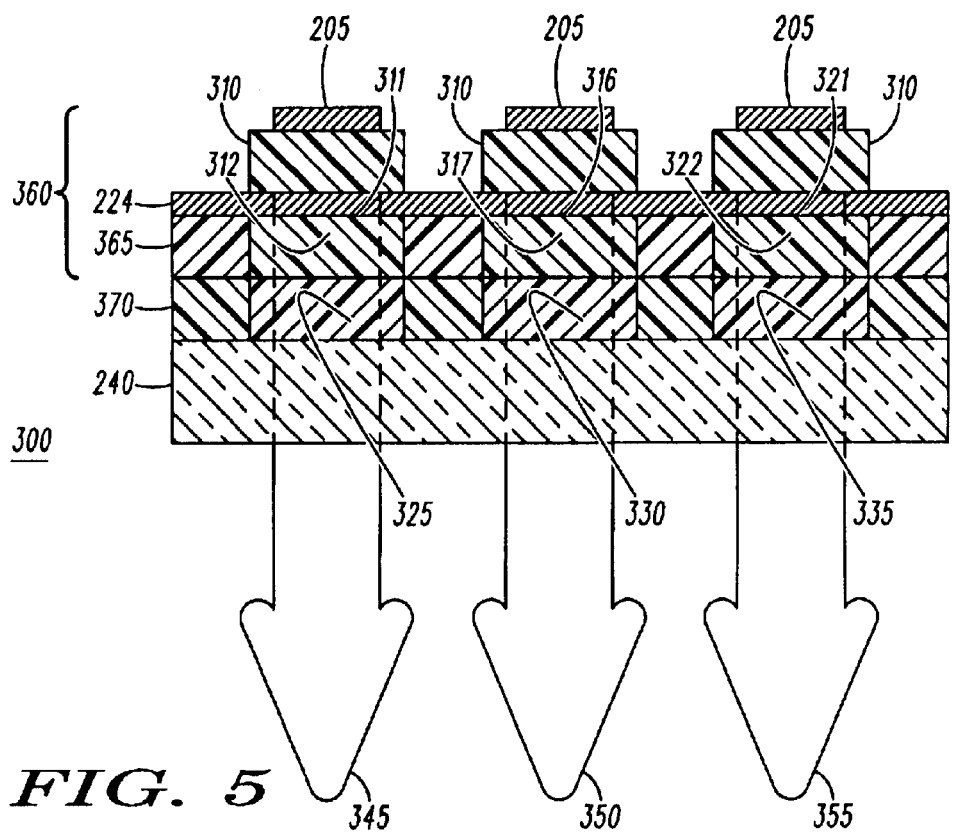
FIGS. 5 and 6 show a cross sectional view of display structures, in accordance with alternative embodiments of the present invention.

Referring now to FIG. 5, a cross sectional view of a display structure 300 is shown, in accordance with a first alternative embodiment of the present invention. The display structure 300 comprises three sets of organic light emitting diodes (OLEDs) that form a portion of a display, of which one OLED from each set is shown. The OLEDs in all three sets are blue OLEDS 310. The blue OLEDS 310 may be the same as the blue OLED 210 or may have differing composition and blue color bands. As in FIG. 2, the blue light 345 is light comprising a range of wavelengths in a blue color band (or, more simply, light in a blue color band) that make the light appear to be blue under normal ambient light circumstances. Analogous statements apply for the green light 350 and red light 355.

The blue light 345 from each of the OLEDs 310 is emitted through a transparent electrode 224 on the front side of the blue OLEDs 310 towards a front of the display. The blue light enters a color changing layer 365 comprising two sets of color changing areas. A blue-to-green conversion area 317 is a member of one of the two sets of color changing areas and a blue-to-red conversion area 322 is a member of the other of the two sets of color changing areas These color changing areas comprise materials that down convert the wavelengths in the band of the blue light to wavelengths that generate a band of green light or red light, and are known to one of ordinary skill in the art. The blue light 345 passes through a portion 312 of the color changing layer 365 that is preferably essentially transparent, but alternatively could be a blue band pass filter that improves the blue saturation of the blue light 345, and emits from a blue OLED emitting area 311 of an organic emissive layer 360 of the display structure 300. The blue OLED emitting area 311 can thus be described as the region at the front of organic emissive layer 360 (in this case, the region of the front surface of the color changing layer 365) through which light from the front of the OLED 310 passes. Likewise, the green light 350 and the red light 355 are emitted, respectively, from a green OLED emitting area 316 and a red OLED emitting area 321 of the organic emissive layer 360 toward the front of the display. (Note that the name "green OLED emitting area" refers to a surface of the organic emissive layer from which green light is emitted, and does not refer to an OLED transmitting green light.) The organic emissive layer 360 comprises the electrodes 205, 224, the sets of OLEDS, the color changing layer 365, and sets of blue, green, and red emitting areas, of which the blue, green and red OLED emitting areas 311, 316, 321 are exemplary members. The transparent electrodes 205 and 224 function and comprise materials as described above with reference to FIG. 2.

Toward the front of the display structure from the organic emissive layer 360 is an excitation prevention layer 370 that comprises three sets of excitation prevention filter areas that positionally match (i.e., axially aligned with), respectively, the sets of blue, green, and red emitting areas. A first excitation prevention filter area 325, a second excitation prevention filter area 330, and a third excitation prevention filter area 335 that are respective members of the three sets of excitation prevention filter areas are shown in FIG. 5. The excitation prevention layer 370 is shown disposed in front of and adjacent to the organic emissive layer 360 in this example, but it need not be disposed adjacent to the organic emissive layer 360. Lastly, a transparent front supporting layer 240 is shown in FIG. 5. It has the same characteristics as described above with reference to FIG. 2.

The excitation prevention filter area 325 of the first set of excitation prevention filter areas blocks a band of light within the light that is incident upon the organic emissive layer 360 from the front of the display (not shown FIG. 5, but represented by the remainder light beam 122 in FIG. 1), wherein the blocked band of light is within the excitation band of the first set of (blue) OLEDs. Unlike the excitation prevention filter area 325, each of the excitation prevention filter areas (e.g., areas 330, 335) of the second and third sets of excitation prevention filter areas block a band of light within the light that is incident upon the organic emissive layer 360 from the front of the display, wherein the blocked band of light is within the excitation band of the respective sets of blue-to-green and blue-to-red conversion areas, or, in other words, within the respective sets of color changing areas. This characteristic is preferred because the color conversion areas are made of materials that are highly photoluminescent. If a high pass filter (instead of a band blocking filter) is used for the excitation prevention filter areas 330, 335, it will be appreciated that photoluminescent excitation of the blue OLEDs 310 that generate the blue light that is converted to green light 350 and red light 355 will also be avoided.

In a variation of the first alternative embodiment of the present invention, the color of the OLEDs 310 is ultraviolet, there is a color conversion area for ultraviolet-to-blue, and the other color conversion areas are ultraviolet-to-green and ultraviolet-to-red.

The sets of excitation prevention filter areas 325, 330, 335 can be made from conventional filter materials or any light filtering materials.

Figure 6:
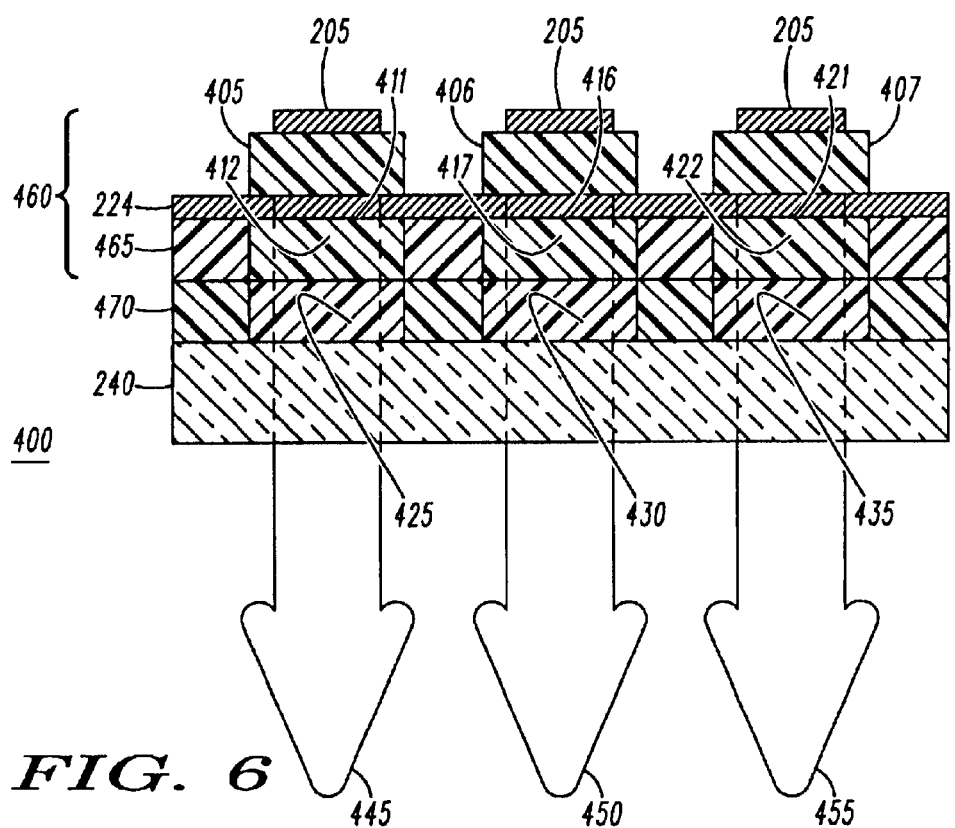

Referring now to FIG. 6, a cross sectional view of a display structure 400 is shown, in accordance with a second alternative embodiment of the present invention. The display structure 400 comprises three sets of organic light emitting diodes (OLEDs) that form a portion of a display, of which one OLED from each set is shown.

The white light 413 from each of the OLEDs 405, 406, 407 is emitted through a transparent electrode 224 on the front side of the white OLEDs 405, 406, 407 towards a front of the display. The white light 413 enters a color changing layer 465 comprising three sets of color changing areas. A white-to-blue band pass filter area 412 is a member of a first of the three sets of color changing areas, a white-to-green band pass filter area 417 is a member of a second of the three sets of color changing areas, and a white-to-red band pass filter area 422 is a member of a third of the three sets of color changing areas These color changing areas comprise materials that pass a band of the wavelengths within the band of the white light, resulting in a band of blue light, green light or red light, and are well known to one of ordinary skill in the art. The white light 413 passing through the band pass filter area 412 emit a blue light 445 from a blue OLED emitting area 411 of an organic emissive layer 460 of the display structure 400. The blue OLED emitting area 411 can be described as the region at the front of organic emissive layer 460 (in this case, the region of the front surface of the color changing layer 465) through which light from the front of the OLED 405 passes. Likewise, the green light 450 and the red light 455 are emitted, respectively, from a green OLED emitting area 416 and a red OLED emitting area 421 of the organic emissive layer 360 toward the front of the display. The organic emissive layer 460 comprises the electrodes 205, 224, the sets of OLEDS, the color changing layer 465, and sets of blue, green, and red emitting areas, of which the blue, green and red OLED emitting areas 411, 416, 421 are exemplary members. The transparent electrodes 205 and 224 function and comprise materials as described above with reference to FIG. 2.

Toward the front of the display structure from the organic emissive layer 460 is an excitation prevention layer 470 that comprises three sets of excitation prevention filter areas that positionally match (i.e., axially aligned with), respectively, the sets of blue, green, and red emitting areas. A first excitation prevention filter area 425, a second excitation prevention filter area 430, and a third excitation prevention filter area 435 that are respective members of the three sets of excitation prevention filter areas are shown in FIG. 6. The excitation prevention layer 470 is shown disposed in front of and adjacent to the organic emissive layer 460 in this example, but it need not be disposed adjacent to the organic emissive layer 460. Lastly, a transparent front supporting layer 240 is shown in FIG. 5. It has the same characteristics as described above with reference to FIG. 2.

The excitation prevention filter area 425 of the first set of excitation prevention filter areas blocks a band of light within the light that is incident upon the organic emissive layer 460 from the front of the display (not shown FIG. 6, but represented by the remainder light beam 122 in FIG. 1), wherein the blocked band of light is within the excitation band of the first set of (white) OLEDs. In particular, it is within an excitation band of a portion of the white OLED 406 that generates blue light. Thus, any photoluminescent light generated by OLED 406 will have substantially reduced wavelengths in the blue band. Analogously, the other two sets of excitation prevention filter areas 430, 435 block a band of the light that is incident upon the organic emissive layer 460 from the front of the display, wherein the blocked band of light is within an excitation band of the respective set of OLEDs that generates light having a color that is the same as the color of the respective band pass filter areas. The sets of excitation prevention filter areas 425, 430, 435 can be made from conventional filter materials or any light filtering materials.

Figure 7:
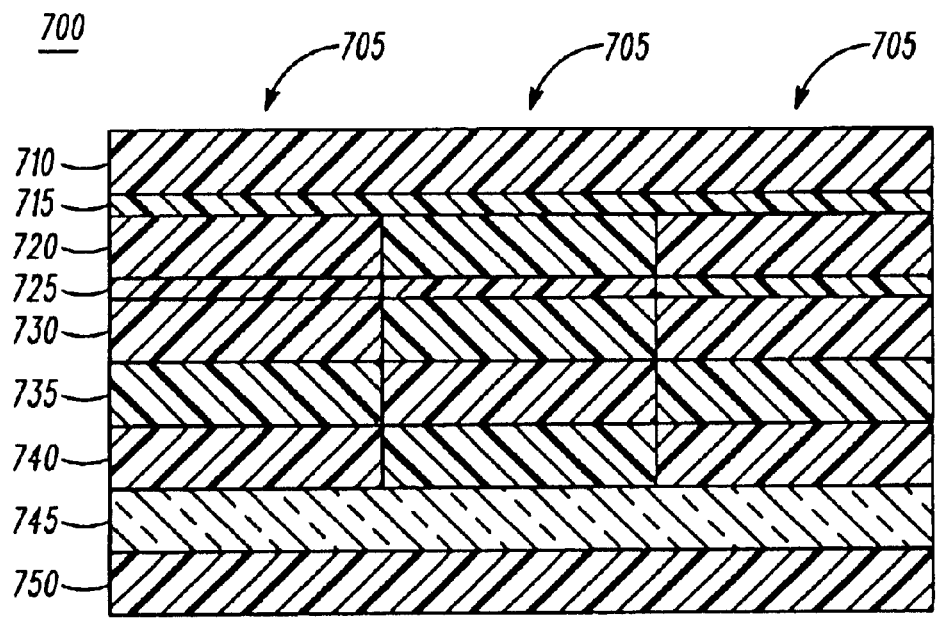
FIGS. 7 and 8 show cross sectional views of display structures, in accordance with alternative embodiments of the present invention that include thin film transistor drivers (TFT).

Referring now to FIG. 7, a cross sectional view of display structure 700 is shown, in accordance with alternative embodiments of the present invention that include thin film transistor drivers (TFT) for each OLED. In FIG. 7, display structure 700 has three areas 705 that correspond to three OLEDS generating light beams that ultimately produce blue, green, and red light that is emitted towards a front of the display structure, at the bottom of FIG. 7. The display structure 700 comprises an encapsulation layer 710, a cathode layer 715, an organic layer 720 comprising OLEDS, a transparent anode layer 725, an optional color changing layer 730, an excitation prevention layer 735, a thin film transistor (TFT) layer 740, a support substrate 745 (e.g., glass), and a circular polarizer layer 750. The encapsulation layer is a conventional layer that provides electrical insulation for the cathode layer 715 and physical protection for the inner portions of the display structure. The cathode layer can comprise low work function high conductivity metal conductors comprising metals or alloys of metals such as calcium, aluminum, and magnesium. The OLEDs can be conventional OLEDS in a conventional Bayer pattern or other pattern. The transparent anode layer 725 can comprise indium tin oxide conductors. The optional color changing layer 730 is included in the display structure 700 structure when the display structure 700 is of or similar to the type described above with reference to FIGS. 5 and 6, and is constructed as described in the paragraphs referencing FIG. 5 or 6, but is not needed when the display structure 700 is of the type described above with reference to FIG. 2. The excitation prevention layer 735 is preferably constructed as described above with reference to one of FIG. 2, 5, or 6, depending on the type of display technology used. The TFTs are of a conventional design for fabricating TFTs, except that isolated areas of the transparent anode layer 725 are preferably coupled to respective transistors of the TFT layer 740 by conductive vias through the optional color changing layer 730, when it is included, and through the excitation prevention layer 735. The TFTs are also coupled to an electrical power supply, which may be done using conductors that are on the glass layer 745. The glass layer 745 is a conventional glass layer or any transparent material on which TFTs can be fabricated. It serves to support the TFTs and protect inner portions of the display structure 700.

Figure 8:
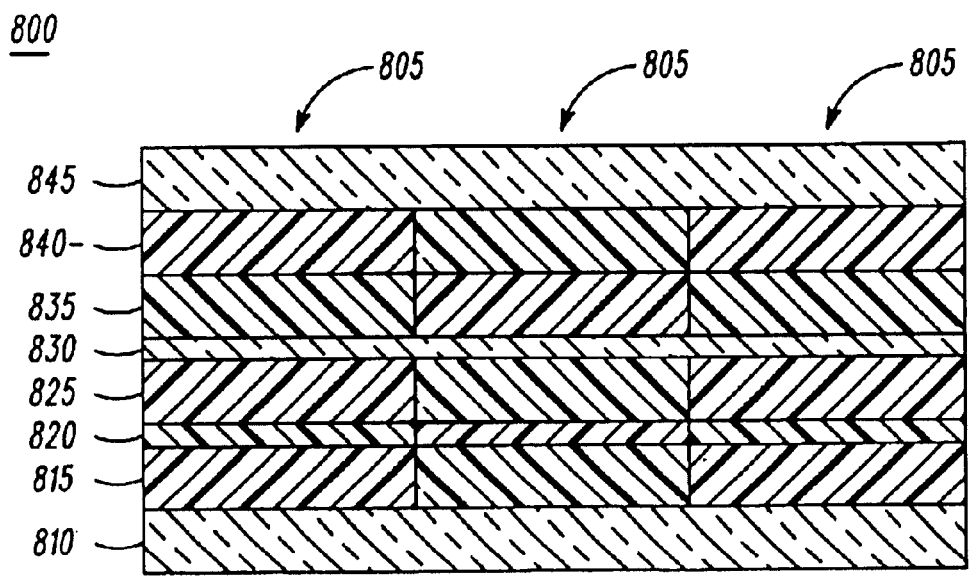

Referring now to FIG. 8, a cross sectional view of display structure 800 is shown, in accordance with alternative embodiments of the present invention that include thin film transistor drivers (TFT) for each OLED. In FIG. 8, display structure 800 has three areas 805 that correspond to three OLEDS generating light beams that ultimately produce blue, green, and red light that is emitted towards a front of the display structure, at the top of FIG. 8. The display structure 800 comprises an substrate 810, a thin film transistor (TFT) layer 815, an anode layer 820, an organic layer 825 comprising OLEDS, a transparent cathode layer 830, an optional color changing layer 835, an excitation prevention layer 840, and a glass layer 845. The substrate 810 comprises a conventional substrate such as a crystalline silicon substrate on which the TFTs are fabricated in a conventional manner. Electric power is supplied to the substrate and TFTs in a conventional manner. The silicon may be a portion of the substrate 810 that includes, for example, a metallic plate to which the silicon is attached for structural strength. The anode layer 820 typically comprises indium tin oxide, but could be of another electrically material compatible with the TFT fabrication process. The OLEDs in the organic layer 825 can be conventional OLEDS arranged in a conventional Bayer pattern or any other pattern. The transparent cathode layer 830 may comprise indium tin oxide, or any other conductive material that is transparent and has no higher work function than the electrically conductive material of the anode layer 820. The optional color changing layer 835 is included in the display structure 800 structure when the display structure 800 is of the type or similar to the type described above with reference to FIGS. 5 and 6, and is constructed as described in the paragraphs referencing FIG. 5 or 6, but it is not needed when the display structure 800 is of the type described above with reference to FIG. 2. The excitation prevention layer 840 is preferably constructed as described above with reference to one of FIG. 2, 5, or 6, depending on the type of display technology used. The glass layer 745 is a conventional glass layer or any material that is transparent and serves to support the display structure 800. The glass layer 745 may be omitted in accordance with some alternative embodiments of the present invention.

It will be appreciated by now that a display structure has been described which uniquely improves the readability of a display by reducing unwanted light emissions from OLED display pixels that are in an OFF state, thereby substantially increasing the ratio of intensity of pixels in the ON state to those in the OFF state. A portion of each of the embodiments of the present invention that are described above with reference to FIGS. 2, 5 and 6, which is that portion that is related to one OLED, can be generally described as comprising an organic emissive layer and an excitation prevention layer. The organic emissive layer comprises a set of first color emitting areas that emit a first color light in response to light that is generated by a first set of organic light emitting diodes (OLEDs) that emit a second color light towards a front of the display from a corresponding first set of OLED emitting areas. The excitation prevention layer is disposed at the front side of the organic emissive layer and comprises a first set of excitation prevention filter areas that positionally match the set of first OLED emitting areas. In accordance with preferred embodiment of the present invention, the first and second colors are the same color. In the first alternative embodiment, the second color is blue and the organic emissive layer further comprises a color changing layer that comprises at least one color conversion area. In the second alternative embodiment, the second color is essentially white and the organic emissive layer further comprises a color changing layer that comprises at least one color bandpass filter area.

It will be further appreciated that a monochrome organic light emitting diode display can benefit from this invention as well as multicolor displays.

It will be further appreciated that the present invention can also be used to improve the visibility of displays formed of inorganic light emitting diodes, such as those formed from indium phosphide, gallium arsenide, and other compound semiconductor materials. Thus, the word "organic" could be deleted and the term "OLED" could be replaced essentially everywhere by "LED" in the detailed description portion of this document.

The display structures described above can provide the benefit of improved readability in a wide range of equipment that presents information to a user, particularly equipment that is used in high ambient light conditions, such as cellular telephones. Such equipment would typically comprise, in addition to a display formed using the above display structures, a conventional processor operating under program instructions that provides the information to be presented.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The term "set" as used herein, means one or more items.

The term "coupled", as used herein with reference to electro-optical technology, is defined as connected, although not necessarily directly, and not necessarily mechanically. The term "set" as used herein does not include an empty set; i.e., there is at least one member in a set.

What is claimed is:

1. A display comprising:

first, second, and third sets of LEDs that emit, respectively, blue, green and red light towards a front of the display from, respectively, sets of blue, green, and red emitting areas; and an excitation prevention layer that comprises three sets of excitation prevention filter areas that positionally match, respectively, the sets of blue, green, and red emitting areas.

2. A display structure comprising:

an emissive layer that comprises a set of first color emitting areas that emit a first color light in response to light that is generated by a first set of light emitting diodes (LEDs) that emit a second color light towards a front of the display structure from a corresponding first set of LED emitting areas; and an excitation prevention layer disposed at a front side of the emissive layer that comprises a first set of excitation prevention filter areas that positionally match the first set of LED emitting areas.

3. The display structure according to claim 2, wherein the first set of excitation prevention filter areas block a band of light that is incident upon the emissive layer from the front of the display structure, wherein the blocked band of light is within an excitation band of the first set of LEDs.

4. The display structure according to claim 2, wherein the first and second color lights are the same color and the set of first color emitting areas is the first set of LED emitting areas.

5. The display structure according to claim 2, wherein the first set of LEDs consists of one LED, the display structure being a portion of a single light emitting device.

6. The display structure according to claim 2, wherein the emissive layer further comprises a set of color changing areas that positionally match the set of first LED emitting areas.

7. The display structure according to claim 6, wherein the second color light is blue light, and wherein the set of color changing areas is one of a set of blue-to-green conversion areas and a set of blue-to-red conversion areas.

8. The display structure according to claim 7, wherein the first set of excitation prevention filter areas block a band of light that is incident upon the emissive layer from the front of the display structure, wherein the blocked band of light is within an excitation band of the set of color changing areas.

9. The display structure according to claim 6, wherein the second color light is essentially white, and wherein the set of color changing areas is one of a set of green band pass filter areas, a set of red band pass filter areas, and a set of blue band pass filter areas.

10. The display structure according to claim 9, wherein the first set of excitation prevention filter areas block a band of light that is incident upon the emissive layer from the front of the display structure, wherein the blocked band of light is within an excitation band of the first set of LEDs that generates light having a color that is the same as the color of the band pass filter areas.

11. The display structure according to claim 2, wherein the emissive layer further comprises:

first electrodes disposed on a back side of the first set of LEDs; and transparent second electrodes disposed on a front side of the first set of LEDs.

12. The display structure according to claim 11, wherein the transparent second electrodes comprise indium tin oxide.

13. The display structure according to claim 11, further comprising:
a back encapsulating layer made of an insulating material disposed parallel to the emissive layer on a back side of the emissive layer;
a thin film transistor layer disposed to a front side of the emissive layer; and
a transparent front supporting layer disposed in front of the emissive layer and the thin film transistor layer, wherein
the first electrodes are cathodes made of a low work function metal.

14. The display structure according to claim 11, further comprising:
a back substrate layer on a back side of the emissive layer;
a thin film transistor layer disposed on the back substrate layer; and
a transparent front supporting layer disposed in front of the emissive layer, wherein
the first electrodes are cathodes made of a metal having a work function that is equal to or less than the work function of the transparent second electrodes.

15. The display structure according to claim 2, further comprising a circular polarizer disposed in front of the excitation prevention layer.

16. The display structure according to claim 2, further comprising an ultraviolet filter disposed in front of the excitation prevention layer.

17. The display structure according to claim 2, wherein the LEDs are organic LEDs.

18. The display structure according to claim 2, wherein the first and second color lights are blue lights, and wherein the set of first color emitting areas is the first set of LED emitting areas, and wherein the emissive layer further comprises:
a second set of LEDs that emit green light towards the front of the display structure from a set of green emitting areas;
a third set of LEDs that emit red light towards the front of the display structure from a set of red emitting areas; and
wherein the excitation prevention layer further comprises second and third sets of excitation prevention filter areas that positionally match, respectively, the sets of green and red emitting areas, wherein each of the first, second and third sets of excitation prevention filter areas block a band of light that is incident upon the emissive layer from the front of the display structure, wherein the blocked band of light is within, respectively, an excitation band of the first, second, and third sets of LEDs.

19. The display structure according to claim 2, wherein the first and second color lights are blue lights, and wherein the emissive layer further comprises:
a second set of LEDs that emit blue light towards the front of the display structure from a second set of LED emitting areas;
a set of blue-to-green conversion areas positionally matching the second set of LED emitting areas, that convert the blue light to green light and emit the green light from a set of green emitting areas;
a third set of LEDs that emit blue light towards the front of the display structure from a third set of LED emitting areas; and a set of blue-to-red conversion areas positionally matching the third set of LED emitting areas that convert the blue light to red light and emit the red light from a set of red emitting areas, and
wherein the excitation prevention layer further comprises second and third sets of excitation prevention filter areas that positionally match, respectively, the sets of green and red emitting areas, wherein the first set of excitation prevention filter areas block a band of light that is incident upon the emissive layer from the front of the display structure, the blocked band of light being within an excitation band of the first set of LEDs, and wherein each of the second and third sets of excitation prevention filter areas block a band of light that is incident upon the emissive layer from the front of the display structure, the blocked band of light being within, respectively, an excitation band of the sets of blue-to-green and blue-to-red conversion areas.

20. The display structure according to claim 2, wherein the first color light is blue light (the set of first color emitting areas being a set of blue emitting areas), the second color light is white, and wherein the emissive layer further comprises:
a second set of LEDs that emit white light towards the front of the display structure from a second set of LED emitting areas;
a set of green bandpass filter areas positionally matching the second set of LED emitting areas that filter the white light to form green light and emit the green light from a set of green emitting areas;
a third set of LEDs that emit white light towards the front of the display structure from a third set of LED emitting areas; and
a set of red bandpass filter areas positionally matching the third set of LED emitting areas that filter the white light to form red light and emit the red light from a set of red emitting areas, and
wherein the excitation prevention layer further comprises second and third sets of excitation prevention filter areas that positionally match, respectively, the sets of green and red emitting areas, wherein each of the first, second, and third sets of excitation prevention filter areas blocks a band of light that is incident upon the emissive layer from the front side of the display structure, wherein the blocked band of light is within an excitation band of the respective set of LEDs that generates light having a color that is the same as the color of the respective band pass filter area.

21. An equipment comprising:
a processor that generates information; and
a display structure that presents the information, comprising:
an emissive layer that comprises a set of first color emitting areas that emit a first color light in response to light that is generated by a first set of light emitting diodes (LEDs) that emit a second color light towards a front of the display structure from a corresponding first set of LED emitting areas; and
an excitation prevention layer disposed at a front side of the emissive layer that comprises a first set of excitation prevention filter areas that positionally match the first set of LED emitting areas.

* * * * *